US011177429B2

(12) United States Patent
Matsuo

(10) Patent No.: US 11,177,429 B2
(45) Date of Patent: Nov. 16, 2021

(54) VIBRATOR ELEMENT, VIBRATOR, OSCILLATOR, ELECTRONIC APPARATUS, AND VEHICLE

(71) Applicant: Seiko Epson Corporation, Tokyo (JP)

(72) Inventor: Atsushi Matsuo, Shiojiri (JP)

(73) Assignee: Seiko Epson Corporation

( * ) Notice: Subject to any disclaimer, the term of this patent is extended or adjusted under 35 U.S.C. 154(b) by 733 days.

(21) Appl. No.: 16/015,609

(22) Filed: Jun. 22, 2018

(65) Prior Publication Data

US 2018/0375012 A1    Dec. 27, 2018

(30) Foreign Application Priority Data

Jun. 23, 2017    (JP) ............................. JP2017-123532

(51) Int. Cl.
*H03H 9/17*    (2006.01)
*H01L 41/09*    (2006.01)
(Continued)

(52) U.S. Cl.
CPC ............ *H01L 41/09* (2013.01); *H01L 41/042* (2013.01); *H03B 5/32* (2013.01); *H03H 9/0547* (2013.01); *H03H 9/10* (2013.01); *H03H 9/1021* (2013.01); *H03H 9/13* (2013.01); *H03H 9/17* (2013.01); *H03H 9/19* (2013.01); *B60R 11/04* (2013.01);
(Continued)

(58) Field of Classification Search
CPC .......... H03H 9/0547; H03H 9/10; H03H 9/13; H03H 9/1021; H03H 9/17; H03H 9/19; H03H 9/02023; H03H 9/02047; H03H 9/02133; H03H 9/0243; H03H 9/02629; H03H 9/02677; H03H 2009/02488;
(Continued)

(56) References Cited

U.S. PATENT DOCUMENTS

| 10,263,597 B2 * | 4/2019 | Sato ........................ H03H 9/132 |
| 2012/0187805 A1 * | 7/2012 | Kohda ..................... H03H 9/19 |
| | | 310/363 |

(Continued)

FOREIGN PATENT DOCUMENTS

| JP | S61-220508 A | 9/1986 |
| JP | 2005-012635 A | 1/2005 |

(Continued)

*Primary Examiner* — J. San Martin
(74) *Attorney, Agent, or Firm* — Harness, Dickey & Pierce, P.L.C.

(57) ABSTRACT

A vibrator element includes a substrate that performs thickness-shear vibration, wherein an outer shape of the substrate in a plan view has a first side and a second side arranged in a first direction along a direction of the thickness-shear vibration and extending along a second direction crossing the first direction, a third side and a fourth side arranged in the second direction and extending in the first direction, a first connecting portion connecting the first side and the third side, and a second connecting portion connecting the first side and the fourth side, the first connecting portion and the second connecting portion are located inside of a region surrounded by the first side, the second side, the third side, the fourth side, and extension lines of these sides in the plan view, and the substrate has broken-off portions projecting from the first connecting portion and the second connecting portion.

19 Claims, 13 Drawing Sheets

(51) Int. Cl.
*H03H 9/13* (2006.01)
*H03H 9/10* (2006.01)
*H03B 5/32* (2006.01)
*H01L 41/04* (2006.01)
*H03H 9/19* (2006.01)
*H03H 9/05* (2006.01)
*B60R 11/04* (2006.01)
*H05K 5/00* (2006.01)
*H04N 5/372* (2011.01)
*B60R 16/02* (2006.01)

(52) U.S. Cl.
CPC .............. *B60R 16/02* (2013.01); *H04N 5/372* (2013.01); *H05K 5/0017* (2013.01)

(58) Field of Classification Search
CPC ....... H01L 41/09; H01L 41/042; H04N 5/372; H05K 5/0017; B60R 11/04; B60R 16/02
See application file for complete search history.

(56) References Cited

U.S. PATENT DOCUMENTS

| | | | |
|---|---|---|---|
| 2013/0208573 A1* | 8/2013 | Arimatsu | H01L 41/107 368/47 |
| 2014/0175944 A1 | 6/2014 | Koyama et al. | |
| 2017/0194935 A1 | 7/2017 | Chiba | |
| 2019/0326876 A1* | 10/2019 | Toshikawa | H03H 9/02023 |
| 2020/0366269 A1* | 11/2020 | Sasaki | H03H 9/0519 |

FOREIGN PATENT DOCUMENTS

| | | |
|---|---|---|
| JP | 2005-130070 A | 5/2005 |
| JP | 2007-142995 A | 6/2007 |
| JP | 2007-158566 A | 6/2007 |
| JP | 2012-186639 A | 9/2012 |
| JP | 2014-127743 A | 7/2014 |
| JP | 2015-177459 A | 10/2015 |
| JP | 2015-204479 A | 11/2015 |
| JP | 2016-127594 A | 7/2016 |
| JP | 2017-076886 A | 4/2017 |

* cited by examiner

VIBRATOR ELEMENT, VIBRATOR, OSCILLATOR, ELECTRONIC APPARATUS, AND VEHICLE

BACKGROUND

1. Technical Field

The present invention relates to a vibrator element, vibrator, oscillator, electronic apparatus, and vehicle.

2. Related Art

As represented by AT cut quartz crystal vibrators, vibrators including vibrator elements that perform thickness-shear vibration as principal vibration are known (for example, see Patent Document 1 (JP-A-2017-76886)).

For example, a piezoelectric vibrator disclosed in Patent Document 1 includes a piezoelectric vibrator element and a package housing the piezoelectric vibrator element. In Patent Document 1, chamfered portions of R chamfer planes or C chamfer planes are provided in four corners of the piezoelectric vibrator element according to the chamfered shapes of the corner parts of R chamfer planes or C chamfer planes on the inner peripheral surface of the package. Thereby, the piezoelectric vibrator element may be mounted to avoid the corner parts of the R chamfer planes or C chamfer planes of the package.

As one of the methods of forming the vibrator element like the piezoelectric vibrator element disclosed in the above described Patent Document 1 from a wafer, a method of forming an outer shape of the vibrator element by etching in a state in which the element is coupled to the wafer via a brittle broken-off portion, and then, detaching the vibrator element from the wafer by breaking the broken-off portion is known. According to the method, etching is used for processing, and thus, dimension accuracy of the obtained vibrator element is higher and better vibration characteristics are easily obtained. Further, outer shapes of a plurality of vibrator elements can be formed by etching at a time and inspection, adjustment, etc. of the plurality of vibrator elements may be performed in the wafer state at a time, and there is an advantage that productivity is higher.

Generally, in a substrate obtained by breakage of the broken-off portion, a part of the broken-off portion is left projecting from the substrate as the broken-off portion. In related art, if downsizing of the package is intended, when the vibrator element having the broken-off portion is placed in the package, the broken-off portion may come into contact with the package.

SUMMARY

An advantage of some aspects of the invention is to provide a vibrator element, vibrator, oscillator, electronic apparatus, and vehicle having downsized packages and better vibration characteristics.

The invention can be implemented as the following application examples or embodiments.

A vibrator element according to an application example includes a substrate having a vibrating part excited to perform thickness-shear vibration as principal vibration, and an electrode placed in the vibrating part, wherein an outer shape of the substrate in a plan view has a first side and a second side arranged in a first direction along a direction of the thickness-shear vibration and extending along a second direction crossing the first direction, a third side and a fourth side arranged in the second direction and extending in the first direction, a first connecting portion connecting the first side and the third side, and a second connecting portion connecting the first side and the fourth side, the first connecting portion and the second connecting portion are located inside of a region surrounded by the first side, the second side, the third side, the fourth side, and extension lines of these sides in the plan view, and the substrate has a broken-off portion projecting from one of the first connecting portion and the second connecting portion.

According to the vibrator element, the broken-off portion projects from one of the first connecting portion and the second connecting portion located inside of the region surrounded by the first side, the second side, the third side, the fourth side, and the extension lines of these sides in the plan view, and thus, the broken-off portion is also located inside of the region or, even when the broken-off portion projects to the outside from the region, the amount of projection may be made smaller. Accordingly, when the vibrator element is placed in a package, contact of the substrate (particularly, the broken-off portion) with the package may be reduced. As a result, the package may be downsized. Further, the outer shape of the substrate in the plan view has the first connecting portion connecting the first side and the third side and the second connecting portion connecting the first side and the fourth side, and thus, symmetry of the shape of the substrate in the second direction may be made higher. Accordingly, secondary vibrations (unnecessary vibrations) as vibrations at different frequencies (e.g. in a flexural vibration mode) from that of the principal vibration (the intended thickness-shear vibration) of the vibrating part may be reduced.

In the vibrator element according to the application example, it is preferable that the broken-off portions project from both the first connecting portion and the second connecting portion.

With this configuration, the symmetry of the shape of the substrate in the second direction may be made higher and unnecessary vibrations may be reduced. When the substrate having the vibrating part is formed from a wafer, the substrate may be stably supported with respect to the wafer by two broken-off portions. Further, when operations for the inspection, adjustment, etc. of the vibrator element are performed in the supported state, energization may be conducted through the two broken-off portions, and there is an advantage that wiring for the operations is easier.

In the vibrator element according to the application example, it is preferable that the outer shape of the substrate in the plan view has a third connecting portion connecting the second side and the third side and a fourth connecting portion connecting the second side and the fourth side, and the third connecting portion and the fourth connecting portion are located inside of the region in the plan view.

With this configuration, when the vibrator element is placed in the package, contact of the substrate (particularly, the third connecting portion and the fourth connecting portion) with the package may be reduced.

In the vibrator element according to the application example, it is preferable that the first connecting portion and the second connecting portion are inclined with respect to the first direction and the second direction in the plan view.

With this configuration, the first connecting portion and the second connecting portion having higher dimension accuracy may be formed relatively easily.

In the vibrator element according to the application example, it is preferable that the first connecting portion and the second connecting portion are curved to project to outside of the substrate in the plan view.

With this configuration, the first connecting portion and the second connecting portion having higher dimension accuracy may be formed relatively easily.

In the vibrator element according to the application example, it is preferable that the first connecting portion and the second connecting portion are formed by parts along the first direction and parts along the second direction and bend to be recessed toward inside of the substrate in the plan view.

With this configuration, the broken-off portion is easily positioned within the above described region.

In the vibrator element according to the application example, it is preferable that a length of the first side and a length of the second side are equal.

With this configuration, the number of modes of unnecessary vibration may be reduced and, as a result, unnecessary vibrations may be further reduced.

In the vibrator element according to the application example, it is preferable that the electrode has an excitation electrode provided in the vibrating part, and a length of the excitation electrode along the second direction is shorter than a length of the first side or the second side along the second direction.

With this configuration, the unnecessary vibrations may be further reduced.

In the vibrator element according to the application example, it is preferable that the broken-off portion is located inside of the region in the plan view.

With this configuration, when the vibrator element is placed in the package, the contact of the substrate (particularly, the broken-off portion) with the package may be further reduced.

A vibrator according to an application example includes the vibrator element of the application example, and a package housing the vibrator element.

According to the vibrator, when the vibrator element is placed in the package, contact of the substrate (particularly, the broken-off portion) with the package is reduced, and thereby, downsizing of the vibrator may be realized. Further, secondary vibrations (unnecessary vibrations) of the vibrator element are reduced, and thereby, characteristics of the vibrator may be improved.

An oscillator according to an application example includes the vibrator element of the application example, a package housing the vibrator element, and a circuit that drives the vibrator element.

According to the oscillator, when the vibrator element is placed in the package, contact of the substrate (particularly, the broken-off portion) with the package is reduced, and thereby, downsizing of the oscillator may be realized. Further, secondary vibrations (unnecessary vibrations) of the vibrator element are reduced, and thereby, characteristics of the oscillator may be improved.

An electronic apparatus according to an application example includes the vibrator element of the application example, and a display unit.

According to the electronic apparatus, characteristics of the electronic apparatus may be improved using the effect of the vibrator element.

A vehicle according to an application example includes the vibrator element of the application example, and an electronic control unit on which the vibrator element is mounted.

According to the vehicle, characteristics of the vehicle may be improved using the effect of the vibrator element.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
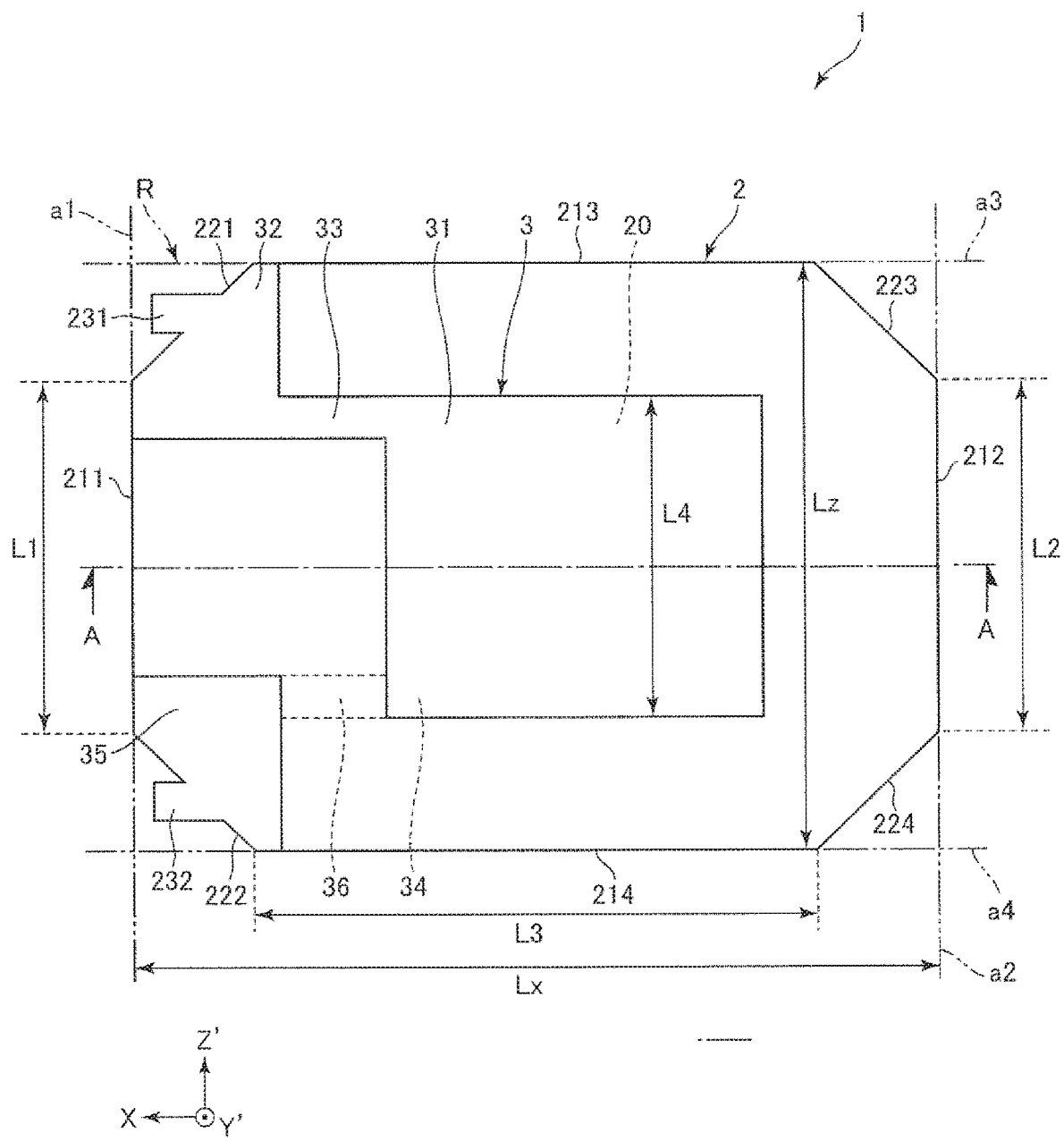
FIG. 1 is a plan view showing a vibrator element according to the first embodiment.

As below, a vibrator element, vibrator, oscillator, electronic apparatus, and vehicle will be explained in detail based on embodiments shown in the drawings.

1. Vibrator Element

First, embodiments of the vibrator element will be explained.

First Embodiment

Figure 2:
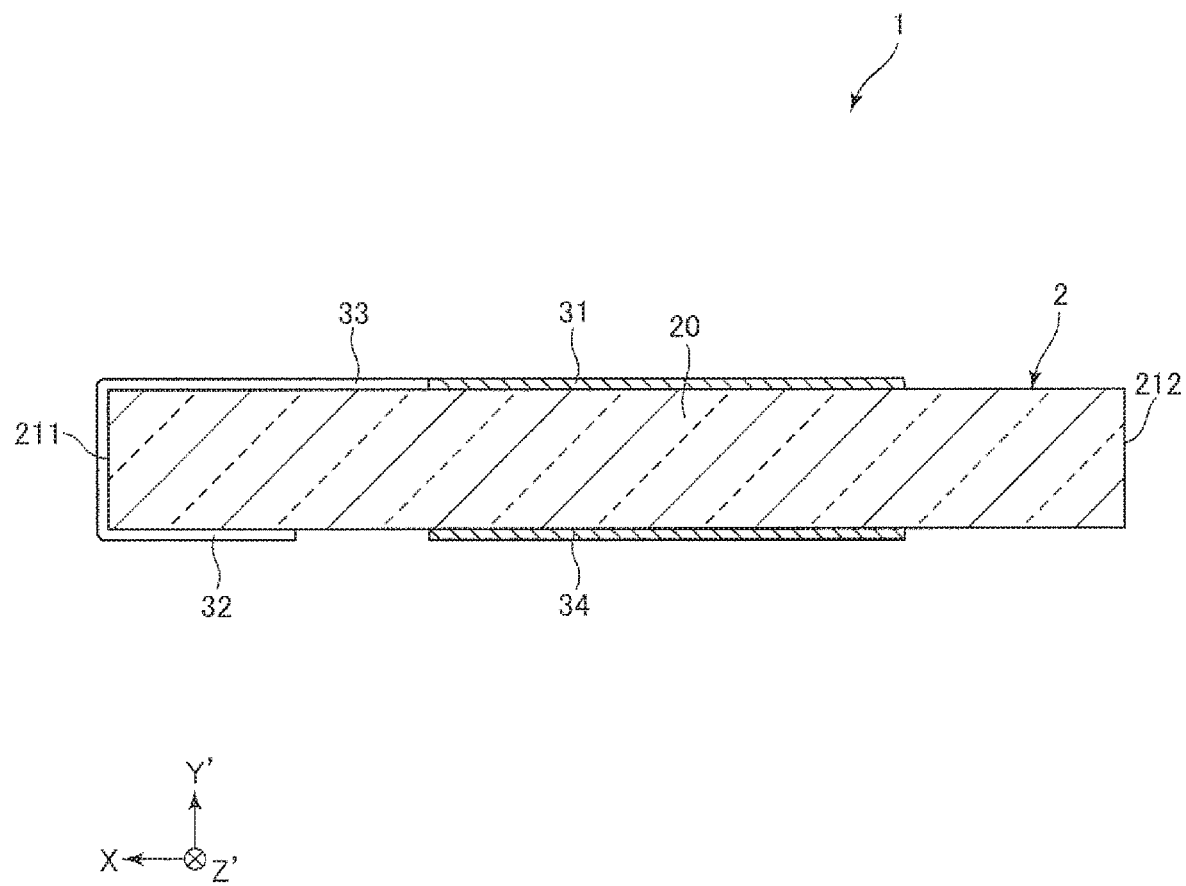
FIG. 2 is a sectional view (longitudinal sectional view) along line A-A in FIG. 1.
Figure 3:
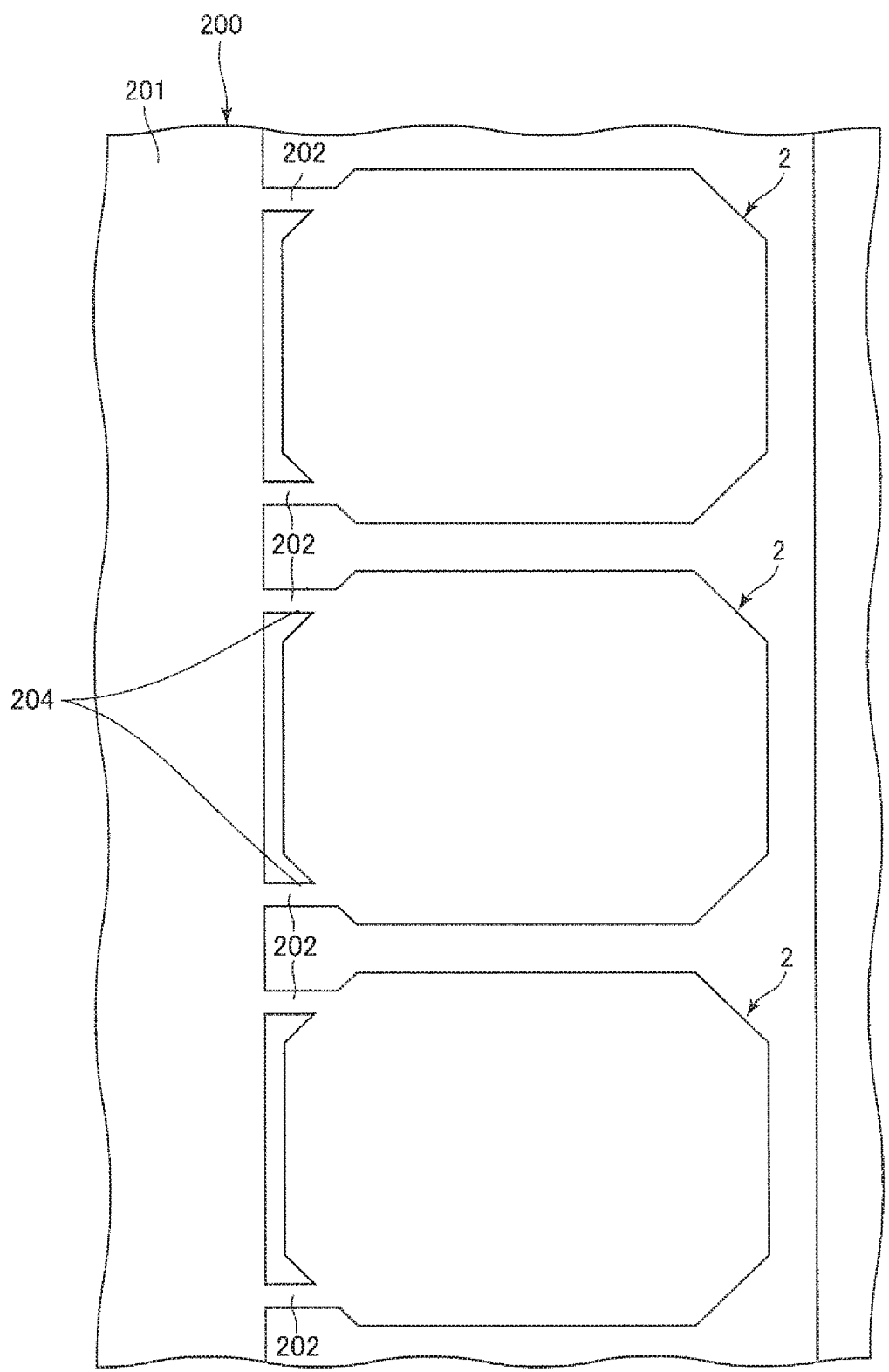
FIG. 3 is a plan view showing substrates coupled to a wafer via broken-off portions at manufacturing of the vibrator element shown in FIG. 1.
Figure 4:
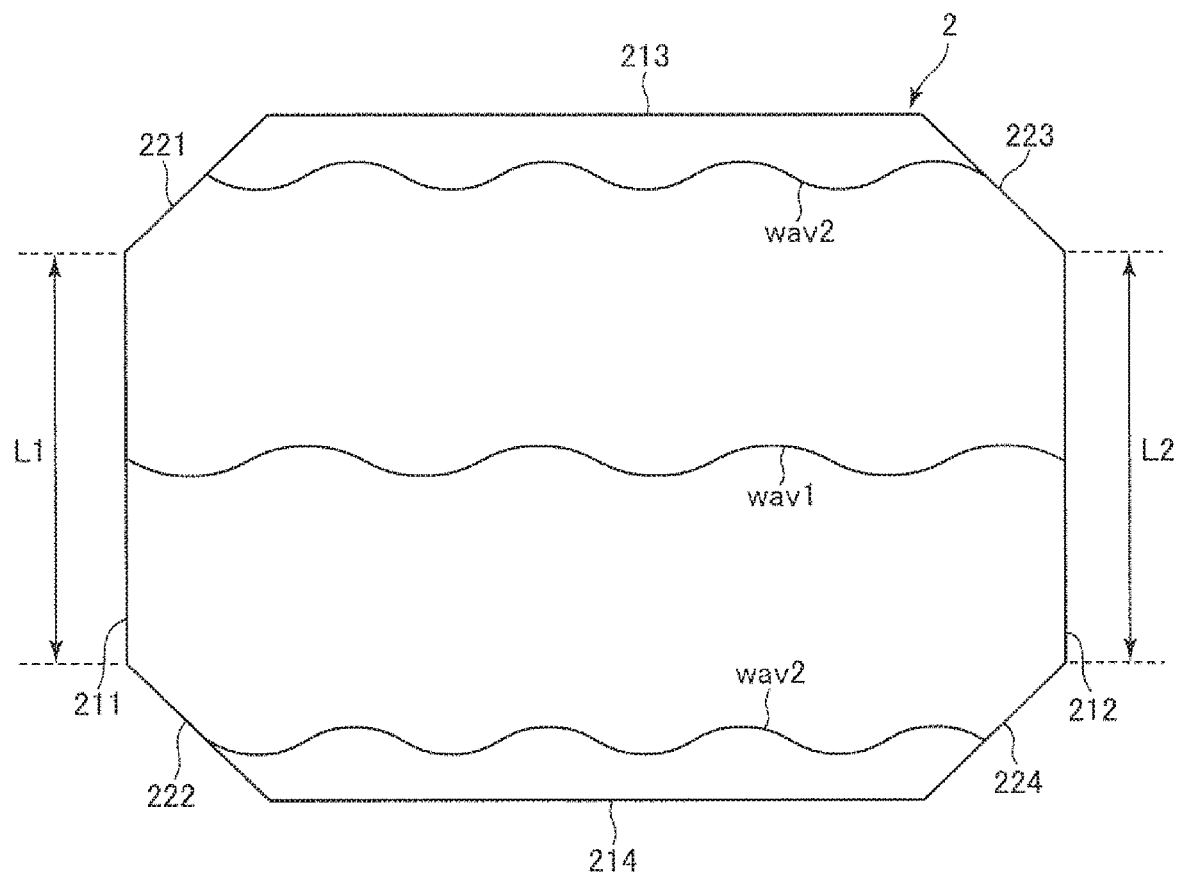
FIG. 4 is a schematic plan view for explanation of a flexural vibration mode of a vibrator element in which a length L1 of a first side and a length L2 of a second side are equal to each other.
Figure 5:
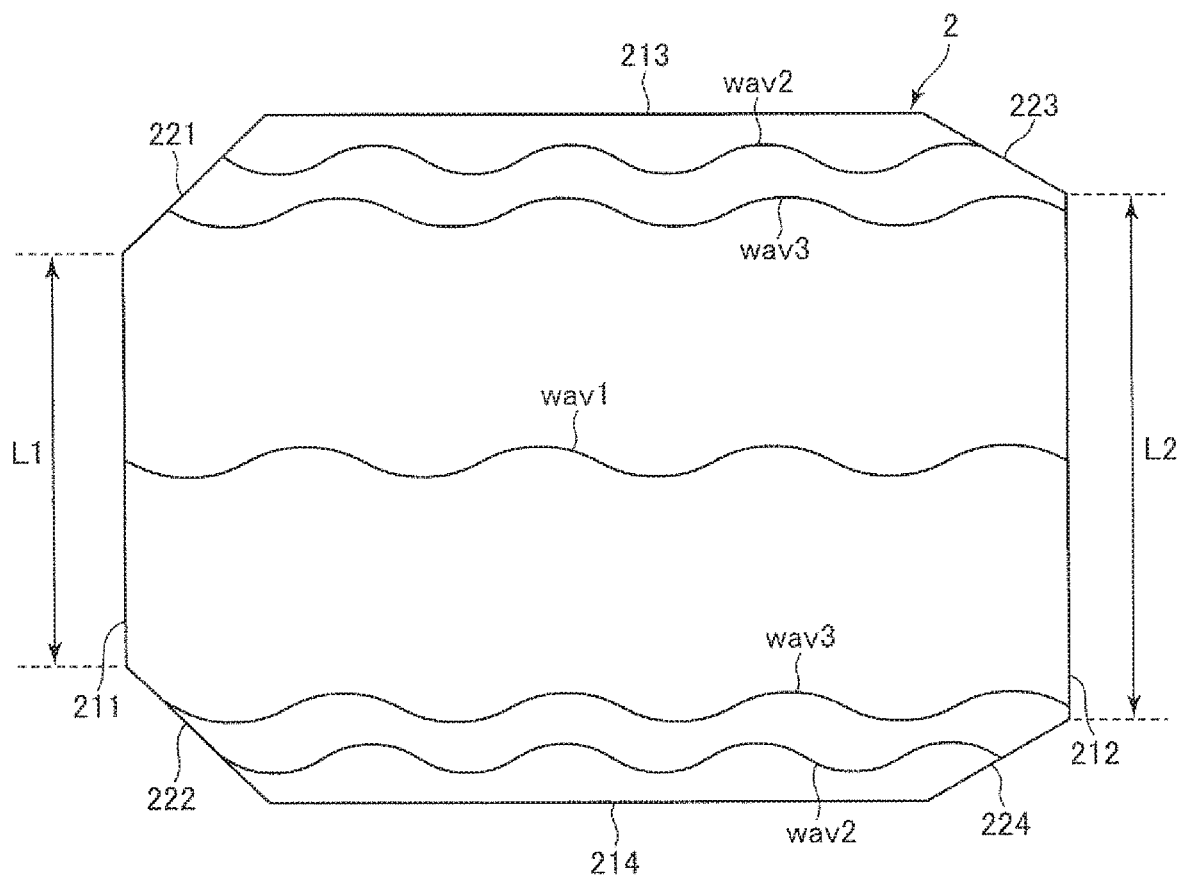
FIG. 5 is a schematic plan view for explanation of a flexural vibration mode of a vibrator element in which the length L1 of the first side and the length L2 of the second side are different from each other.

FIG. 1 is a plan view showing a vibrator element according to the first embodiment. FIG. 2 is a sectional view (longitudinal sectional view) along line A-A in FIG. 1. FIG. 3 is a plan view showing substrates coupled to a wafer via broken-off portions at manufacturing of the vibrator element shown in FIG. 1. FIG. 4 is a schematic plan view for explanation of a flexural vibration mode of a vibrator element in which a length L1 of a first side and a length L2 of a second side are equal to each other. FIG. 5 is a schematic plan view for explanation of a flexural vibration mode of a vibrator element in which the length L1 of the first side and the length L2 of the second side are different from each other.

As shown in FIGS. 1 and 2, a vibrator element 1 has a substrate 2 as a piezoelectric substrate and an electrode 3 provided on the substrate 2, and thickness-shear vibration is excited as principal vibration in the substrate 2 by energization of the electrode 3.

The substrate 2 of the embodiment is a quartz crystal substrate. Here, the quartz crystal as a constituent material of the substrate 2 belongs to the tribunal system and has an X-axis, Y-axis and Z-axis orthogonal to one another as crystal axes. The X-axis, the Y-axis and the Z-axis are referred to as "electrical axis", "mechanical axis", and "optical axis", respectively. In the embodiment, the substrate 2 is "rotational Y cut quartz crystal substrate" cut out along the plane obtained by rotation of the XZ-plane (the plane orthogonal to the Y-axis) about the X-axis by a predetermined angle θ. An AT cut quartz crystal substrate as a rotational Y cut quartz crystal substrate at θ=35° 15' is used as the substrate 2, and thereby, the vibrator element 1 having better temperature characteristics is obtained. Note that the substrate 2 is not limited to the AT cut quartz crystal substrate as long as the substrate may be excited to perform thickness-shear vibration, but e.g. a BT cut or SC cut quartz crystal substrate may be used.

The Y-axis and the Z-axis rotated about the X-axis by the angle θ are referred to as "Y'-axis" and "Z'-axis", respectively. Accordingly, the substrate 2 has a thickness direction parallel to the Y'-axis and a principal surface spreading along the XZ'-plane (the plane orthogonal to the Y'-axis). Note that, hereinafter, directions parallel to the X-axis are referred to as "X-axis directions", directions parallel to the Y'-axis are referred to as "Y'-axis directions", and directions parallel to the Z'-axis are referred to as "Z'-axis directions".

The substrate 2 has a substantially rectangular shape with four C-chamfered corners in a plan view as seen from the thickness direction (Y'-axis direction) (hereinafter, also simply referred to as "plan view"). That is, the substrate 2 has a first side 211 and a second side 212 arranged in the X-axis direction and extending in the Z'-axis direction, a third side 213 and a fourth side 214 arranged in the Z'-axis direction and extending in the X-axis direction, a linear first connecting portion 221 connecting the adjacent ends of the first side 211 and the third side 213, a linear second connecting portion 222 connecting the adjacent ends of the first side 211 and the fourth side 214, a linear third connecting portion 223 connecting the adjacent ends of the second side 212 and the third side 213, and a linear fourth connecting portion 224 connecting the adjacent ends of the second side 212 and the fourth side 214 in the plan view. Further, the substrate 2 has a broken-off portion 231 (projecting portion) projecting from the first connecting portion 221 in the +X-axis direction and a broken-off portion 232 (projecting portion) projecting from the second connecting portion 222 in the +X-axis direction. Note that the plan view shape of the substrate 2 and the broken-off portions 231, 232 will be described later in detail.

As shown in FIGS. 1 and 2, the substrate 2 has a vibrating part 20 excited to perform thickness-shear vibration as principal vibration. In the embodiment, the substrate 2 has a flat plate shape, and the part located between excitation electrodes 31, 34, which will be described later, of the substrate 2 mainly forms the vibrating part 20. Note that the shape of the substrate 2 is not limited to the simple flat plate shape, but may have e.g. the so-called mesa shape or inverted mesa shape. In the case of the mesa shape, the thicker part of the substrate 2 mainly forms the vibrating part 20, and, in the case of the inverted mesa shape, the thinner part of the substrate 2 mainly forms the vibrating part 20.

The electrode 3 has a pair of the excitation electrodes 31, 34 provided in the vibration part 20 of the substrate 2, a pair of extraction electrodes 33, 36 extracted from the pair of the excitation electrodes 31, 34 to the outer peripheral part of the substrate 2, and a pair of pad electrodes 32, 35 provided in the outer peripheral part of the substrate 2 and connected to the pair of extraction electrodes 33, 36.

The excitation electrode 31 is placed on one surface (on the upside in FIG. 2) of the vibrating part 20. The excitation electrode 34 is placed on the other surface (on the downside in FIG. 2) of the vibrating part 20 to be opposed to the excitation electrode 31 via the vibrating part 20. The pad electrodes 32, 35 are placed side by side in the Z'-axis direction on the end part on the +X-axis direction side of the substrate 2. The extraction electrode 33 electrically connects the excitation electrode 31 and the pad electrode 32 on the one surface (on the upside in FIG. 2) of the vibrating part 20. The extraction electrode 36 electrically connects the excitation electrode 34 and the pad electrode 35 on the other surface (on the downside in FIG. 2) of the vibrating part 20.

The configuration of the electrode 3 is not particularly limited, but may be formed using e.g. a metal coating in which a metal of Au (gold), Al (aluminum), or the like or an alloy principally consisting of Au, Al on a foundation layer of Cr (chromium), Ni (nickel), or the like. Note that, obviously, the shape of the electrode 3 shown in FIG. 1 is an example, but not limited to that.

In the vibrator element 1 having the above described configuration, when a voltage that periodically changes is applied between the pair of the excitation electrodes 31, 34 through the pair of pad electrodes 32, 35, the thickness-shear vibration of the vibrating part 20 is excited at a desired frequency.

Further, the vibrator element 1 having the above described configuration is manufactured in the following manner, for example.

First, a quartz crystal substrate (wafer) is wet-etched or dry-etched, and thereby, a plurality of the substrates 2 are formed. In this regard, as shown in FIG. 3, the plurality of substrates 2 are coupled to another part 201 of the quartz crystal substrate 200 via pairs of brittle connecting portions 202 (hereinafter, also referred to as "wafer state").

Then, while in the wafer state, metal films are uniformly formed by e.g. a deposition apparatus for sputtering or the like on the surfaces of the respective substrates 2. Then, photoresists are applied thereto and exposed to light and developed, and thereby, resist masks are obtained. Then, the metal films in the parts exposed from the resist masks are removed using an etching solution, and the electrodes 3 are formed. Thereby, the plurality of vibrator elements 1 in the wafer state are obtained. In this regard, electrodes for inspection, adjustment, etc. of the vibrator elements 1 may be formed collectively with the electrodes 3 in the part 201. The electrodes are electrically connected to the electrodes 3 through the pairs of connecting portions 202.

Then, while in the wafer state, as appropriate, the vibrator elements 1 are driven using the above described electrodes for inspection, adjustment, etc., and the inspection, adjustment, etc. of the vibrator elements 1 are performed. Then, the respective connecting portions 202 are broken, and thereby, the vibrator elements 1 are separated from the part 201 of the quartz crystal substrate 200.

In the above described manner, the plurality of vibrator elements 1 are obtained. Here, parts of the respective connecting portions 202 are left as the broken-off portions 231, 232 in the obtained vibrator elements 1. Further, the respective obtained vibrator elements 1 are mounted on e.g. 41 of packages 4, which will be described later.

As above, the schematic configuration of the vibrator element 1 is explained. As described above, the vibrator element 1 includes the substrate 2 having the vibrating part 20 excited to perform thickness-shear vibration as principal vibration, and the electrode 3 placed in the vibrating part 20. Further, the outer shape of the substrate 2 in the plan view has the first side 211 and the second side 212 arranged in the X-axis direction (a first direction) along a direction of the thickness-shear vibration of the vibrating part 20 and extending in the Z'-axis direction (a second direction crossing the first direction), the third side 213 and the fourth side 214 arranged in the Z'-axis direction and extending in the X-axis direction, the first connecting portion 221 connecting the first side 211 and the third side 213, and the second connecting portion 222 connecting the first side 211 and the fourth side 214.

Here, the first connecting portion 221 and the second connecting portion 222 are respectively located inside of a region R surrounded by the first side 211, the second side 212, the third side 213, the fourth side 214, and extension lines a1, a2, a3, a4 of these sides in the plan view. Further, the substrate 2 has the broken-off portion 231 projecting from the first connecting portion 221 and the broken-off portion 232 projecting from the second connecting portion 222.

According to the vibrator element 1, the broken-off portions 231, 232 project from the first connecting portion 221 and the second connecting portion 222 located inside of the region R surrounded by the first side 211, the second side 212, the third side 213, the fourth side 214, and the extension lines a1, a2, a3, a4 of these sides in the plan view, and thus, the broken-off portions 231, 232 are also located inside of the region R or, even when the broken-off portions 231, 232 project to the outside from the region R, the amounts of projection may be made smaller. Accordingly, when the vibrator element 1 is placed in the package 4 to be described later, contact of the substrate 2 (particularly, the broken-off portions 231, 232) with the package 4 may be reduced. As a result, there is an advantage that the package 4 may be downsized.

Further, the outer shape of the substrate 2 in the plan view has the first connecting portion 221 connecting the first side 211 and the third side 213 and the second connecting portion 222 connecting the first side 211 and the fourth side 214, and thus, symmetry of the shape of the substrate 2 in the Z'-axis direction (second direction) may be made higher. In the embodiment, the substrate 2 has a symmetric shape in the Z'-axis direction. Accordingly, secondary vibrations (unnecessary vibrations) as vibrations at different frequencies (e.g. in the flexural vibration mode) from that of the principal vibration (the intended thickness-shear vibration) of the vibrating part 20 may be reduced.

In the embodiment, the outer shape of the substrate in the plan view has the third connecting portion 223 connecting the second side 212 and the third side 213 and the fourth connecting portion 224 connecting the second side 212 and the fourth side 214. Further, the third connecting portion 223 and the fourth connecting portion 224 are respectively located inside of the region R in the plan view. Thereby, when the vibrator element 1 is placed in the package 4 to be described later, contact of the substrate 2 (particularly, the third connecting portion 223 and the fourth connecting portion 224) with the package 4 may be reduced.

In the embodiment, as described above, the first to fourth connecting portions 221 to 224 respectively have C-chamfered shapes. Therefore, the first connecting portion 221 and the second connecting portion 222 respectively extend in directions inclined with respect to the X-axis direction (first direction) and the Z'-axis direction (second direction) in the plan view. Thereby, the first connecting portion 221 and the second connecting portion 222 having higher dimension accuracy may be formed relatively easily.

Similarly, the third connecting portion 223 and the fourth connecting portion 224 respectively extend in directions inclined with respect to the X-axis direction (first direction) and the Z'-axis direction (second direction) in the plan view. Thereby, the third connecting portion 223 and the fourth connecting portion 224 having higher dimension accuracy may be formed relatively easily.

Here, the length L1 of the first side 211 and the length L2 of the second side 212 are equal. Thereby, the number of modes of unnecessary vibrations may be reduced and, as a result, the unnecessary vibrations may be further reduced.

In the case where the length L1 of the first side 211 and the length L2 of the second side 212 are equal, for example, as shown in FIG. 4, when the outer shape of the substrate 2 is the symmetric shape in the Z'-axis direction, an unnecessary vibration mode Wav1 is generated between the first side 211 and the second side 212, and unnecessary vibration modes Wav2 at a different wavelength from that of the unnecessary vibration mode Wav1 are respectively generated between the first connecting portion 221 and the third connecting portion 223 and between the second connecting portion 222 and the fourth connecting portion 224. That is, in this case, the number of the generated unnecessary vibration modes is two.

On the other hand, in the case where the length L1 of the first side 211 and the length L2 of the second side 212 are different, for example, as shown in FIG. 5, even when the outer shape of the substrate 2 is the symmetric shape in the Z'-axis direction, the unnecessary vibration mode Wav1 is generated between the first side 211 and the second side 212, the unnecessary vibration modes Wav2 at the different wavelength from that of the unnecessary vibration mode Wav1 are respectively generated between the first connecting portion 221 and the third connecting portion 223 and between the second connecting portion 222 and the fourth connecting portion 224, and unnecessary vibration modes Wav3 are generated between the first connecting portion 221 and the second side 212 and the second connecting portion 222 and the second side 212. That is, in this case, the number of the generated unnecessary vibration modes is three.

As described above, the length L1 of the first side 211 and the length L2 of the second side 212 are made equal, and the outer shape of the substrate 2 is made the symmetric shape in the Z'-axis direction, and thereby, the number of unnecessary vibration modes may be reduced.

The length L1 of the first side 211 and the length L2 of the second side 212 are not particularly limited, but preferably from 0.5 times to 0.9 times a length Lz of the substrate 2 in the Z'-axis direction and more preferably from 0.6 times to 0.8 times the length. Further, it is preferable that $(Lz-L2)/2 < 100$ μm. Thereby, the contact of the substrate 2 with the package 4 may be reduced and the vibration efficiency of the substrate 2 may be made better.

A length L3 of the third side 213 or fourth side 214 is determined according to the wavelength of the thickness-shear vibration of the vibrating part 20 or the like and not particularly limited, but preferably from 0.5 times to 0.9 times a length Lx of the substrate 2 in the X-axis direction and more preferably from 0.6 times to 0.8 times the length. Further, it is preferable that (Lx−L3)/2<100 μm. Thereby, there are advantages that the contact of the substrate 2 with the package 4 may be reduced and the influence of unnecessary vibrations on the principal vibration may be easily reduced.

In the embodiment, the broken-off portions 231, 232 are located inside of the region R in the plan view. Thereby, when the vibrator element 1 is placed in the package 4, compared to the case where the broken-off portions 231, 232 project to the outside from the region R, the contact of the substrate 2 (particularly, the broken-off portions 231, 232) with the package 4 may be further reduced. Note that an example of the method of reliably positioning the broken-off portions 231, 232 within the region R includes providing e.g. notches or easily-broken portions (brittle portions) 204 such as thinner portions in parts of the connecting portions 202 to be described later within the region R (see FIG. 3).

Further, the broken-off portions 231, 232 project from the first connecting portion 221 and the second connecting portion 222, respectively. Thereby, the symmetry of the shape of the substrate 2 in the Z'-axis direction (second direction) may be made higher and unnecessary vibrations may be reduced. When the substrate 2 having the vibrating part 20 is formed from the above described quartz crystal substrate 200 (wafer), the substrate 2 may be stably supported with respect to the quartz crystal substrate 200 by the two connecting portions 202. Further, when operations for the inspection, adjustment, etc. of the vibrator element 1 are performed in the supported state (wafer state), energization may be conducted through the two connecting portions 202, and there is an advantage that wiring for the operations is easier.

In the embodiment, the broken-off portions 231, 232 respectively project in the +X-axis direction. Thereby, a plurality of the substrates 2 may be efficiently placed in the above described wafer state. Note that the projection direction of the broken-off portions 231, 232 is not particularly limited to that. For example, the broken-off portion 231 may project in a direction at an arbitrary angle between the +Z'-axis direction and the +X-axis direction or the broken-off portion 232 may project in a direction at an arbitrary angle between the −Z'-axis direction and the +X-axis direction.

Note that, in the embodiment, the pair of broken-off portions 231, 232 are provided in the vibrator element 1, however, one of the broken-off portions 231, 232 may be omitted. That is, it is only necessary that the vibrator element 1 has the broken-off portion projecting from at least one of the first connecting portion 221 and the second connecting portion 222. When one of the broken-off portions 231, 232 is omitted, one of the pair of connecting portions 202 may be omitted in the above described wafer state. Further, the shapes of the broken-off portions 231, 232 are not limited to the illustrated shapes. For example, at least one of the width and the thickness of the broken-off portions 231, 232 may not be necessarily constant. In FIG. 1, for convenience of explanation, the broken surfaces (end surfaces) of the broken-off portions 231, 232 have flat shapes, however, the actual shapes of the broken surfaces differ depending on the breakage situations and may be rough.

The electrode 3 has the excitation electrodes 31, 34 provided in the vibrating part 20, and it is preferable that a length L4 of the excitation electrodes 31, 34 along the Z'-axis direction (second direction) is shorter than the length L1 of the first side 211 or the length L2 of the second side 212. Thereby, the unnecessary vibrations may be further reduced. Here, in view of further reduction of the unnecessary vibrations with better drive efficiency, it is preferable that L4/L1 or L4/L2 is from 0.7 to 0.9.

Note that, in FIG. 1, the lengths (L1, L2) of the first side 211 and the second side 212 are shorter than the lengths of the third side 213 and the fourth side 214, respectively. The lengths (L1, L2) of the first side 211 and the second side 212 may be equal to the lengths of the third side 213 and the fourth side 214 or longer than the third side 213 and the fourth side 214, respectively.

Second Embodiment

Next, the second embodiment of the vibrator element will be explained.

Figure 6:
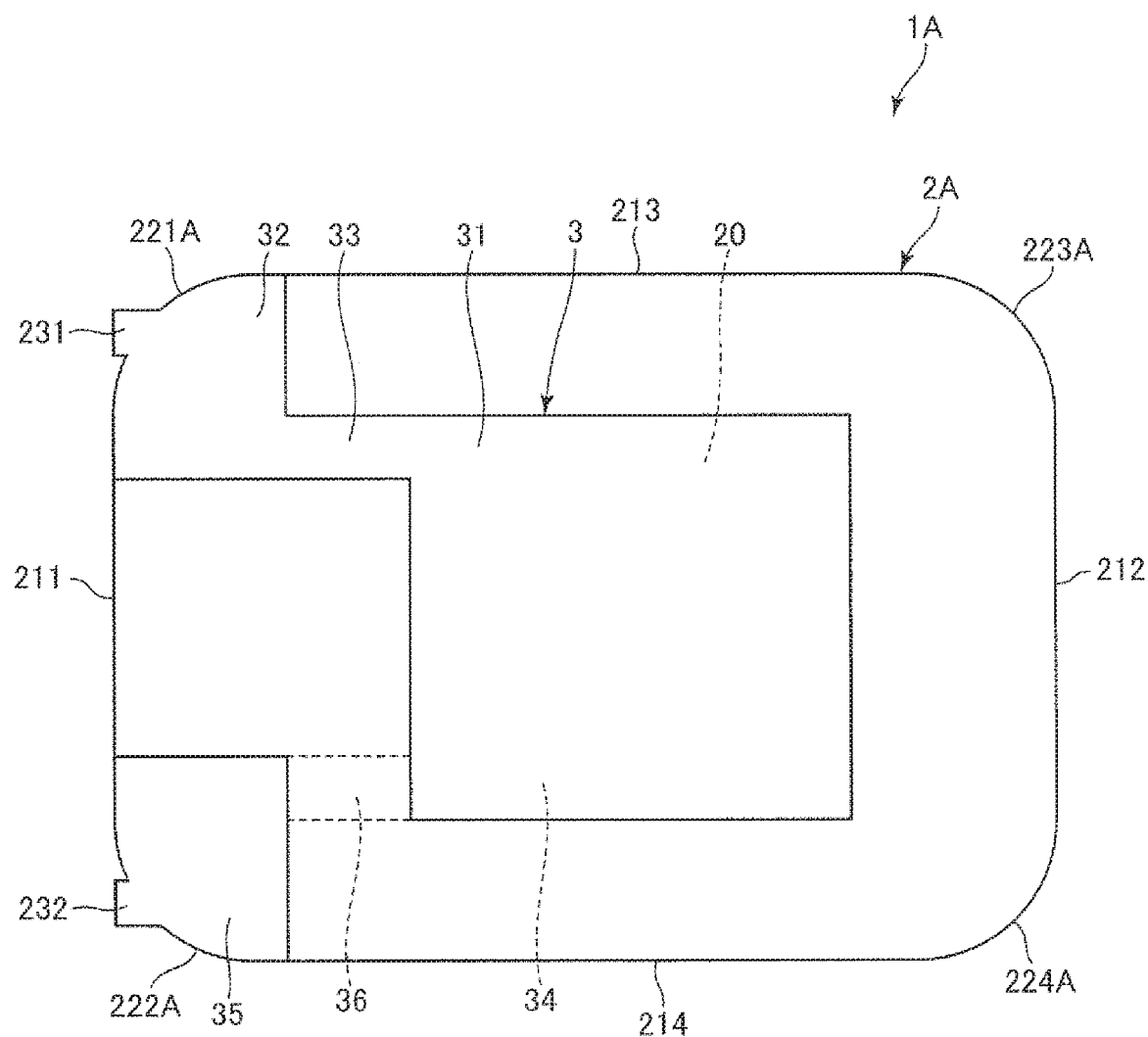
FIG. 6 is a plan view showing a vibrator element according to the second embodiment.

FIG. 6 is a plan view showing a vibrator element according to the second embodiment.

As below, the vibrator element of the second embodiment will be explained with a focus on differences from the above described embodiment, and the explanation of the same items will be omitted. In FIG. 6, the same configurations as those of the above described embodiment have the same signs.

The second embodiment is the same as the above described first embodiment except that the plan view shape of the substrate is different.

A vibrator element 1A shown in FIG. 6 includes a substrate 2A having the vibrating part 20 and the electrode 3 provided on the substrate 2A.

The substrate 2A has substantially a rectangular shape with four corners respectively R-chamfered in the plan view. That is, the substrate 2A has the first side 211, the second side 212, the third side 213, and the fourth side 214, a curved first connecting portion 221A connecting the adjacent ends of the first side 211 and the third side 213, a curved second connecting portion 222A connecting the adjacent ends of the first side 211 and the fourth side 214, a curved third connecting portion 223A connecting the adjacent ends of the second side 212 and the third side 213, and a curved fourth connecting portion 224A connecting the adjacent ends of the second side 212 and the fourth side 214 in the plan view. Further, the substrate 2A has the broken-off portion 231 projecting from the first connecting portion 221A in the +X-axis direction and the broken-off portion 232 projecting from the second connecting portion 222A in the +X-axis direction.

As described above, the first connecting portion 221A and the second connecting portion 222A are respectively curved to project to the outside of the substrate 2A in the plan view. Thereby, the first connecting portion 221A and the second connecting portion 222A having higher dimension accuracy may be formed relatively easily. Similarly, the third connecting portion 223A and the fourth connecting portion 224A are respectively curved to project to the outside of the substrate 2A in the plan view. Thereby, the third connecting portion 223A and the fourth connecting portion 224A having higher dimension accuracy may be formed relatively easily. Note that these connecting portions respectively have arc shapes in the drawing, however, the shapes are not limited to those as long as the portions are rounded. Further, the radius of curvature can be appropriately set.

According to the above described second embodiment, when the vibrator element 1A is placed in the package 4 to be described later, contact of the substrate 2A (particularly, the broken-off portions 231, 232) with the package 4 may be reduced. As a result, the package 4 may be downsized. Further, secondary vibrations (unnecessary vibrations) as vibrations at different frequencies (e.g. in the flexural vibration mode) from that of the principal vibration (the intended thickness-shear vibration) of the vibrating part 20 may be reduced.

Third Embodiment

Next, the third embodiment of the vibrator element will be explained.

Figure 7:
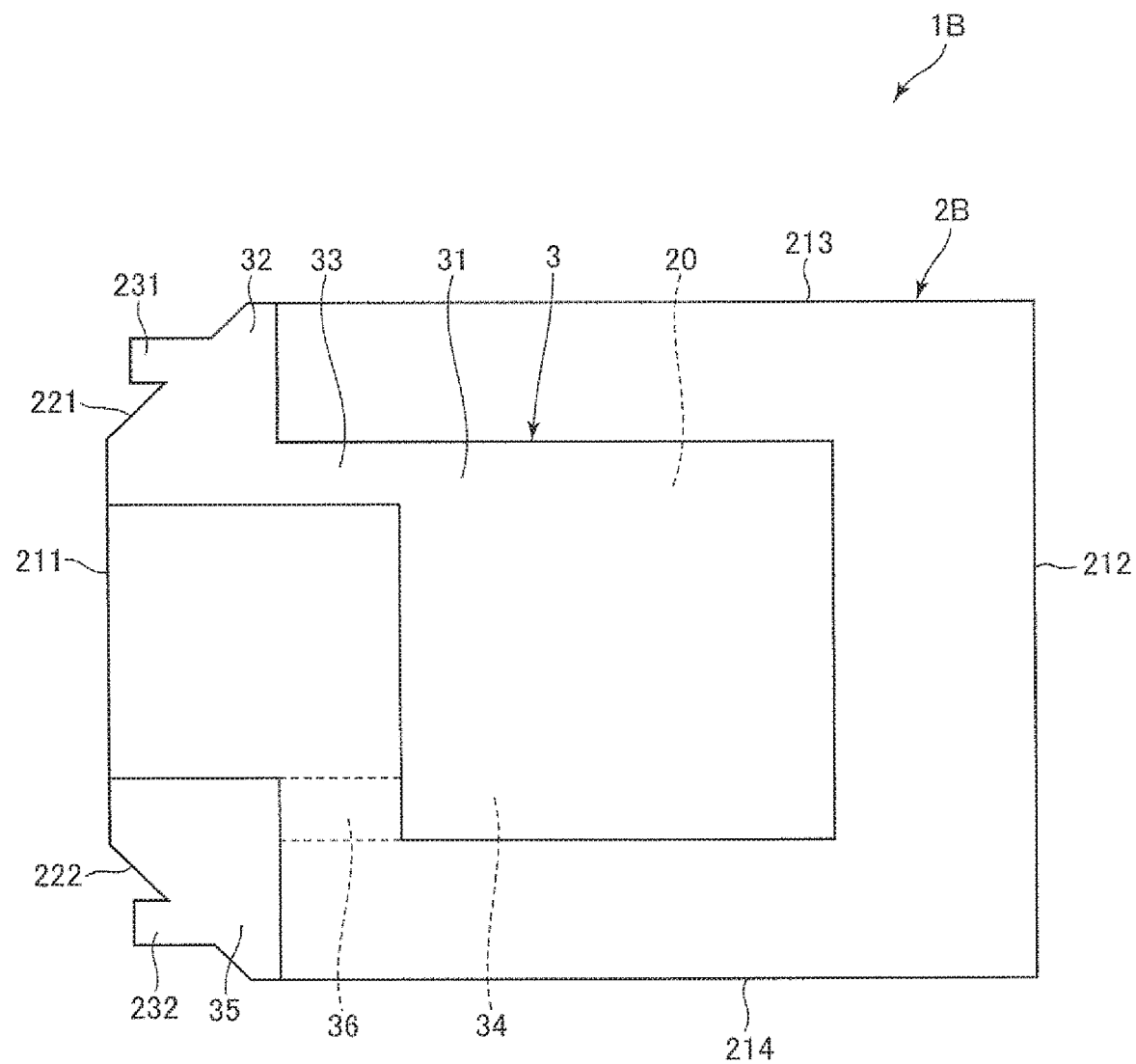
FIG. 7 is a plan view showing a vibrator element according to the third embodiment.

FIG. 7 is a plan view showing a vibrator element according to the third embodiment.

As below, the vibrator element of the third embodiment will be explained with a focus on differences from the above described embodiments, and the explanation of the same items will be omitted. In FIG. 7, the same configurations as those of the above described embodiments have the same signs.

The third embodiment is the same as the above described first embodiment except that the plan view shape of the substrate is different.

A vibrator element 1B shown in FIG. 7 includes a substrate 2B having the vibrating part 20 and the electrode 3 provided on the substrate 2B.

The substrate 2B has substantially a rectangular shape with only two corners respectively C-chamfered in the plan view. That is, the substrate 2B has the first side 211, the second side 212, the third side 213, and the fourth side 214, the linear first connecting portion 221 connecting the adjacent ends of the first side 211 and the third side 213, the linear second connecting portion 222 connecting the adjacent ends of the first side 211 and the fourth side 214, and the second side 212 is directly connected to the third side 213 and the fourth side 214 in the plan view. Further, the substrate 2B has the broken-off portion 231 projecting from the first connecting portion 221 in the +X-axis direction and the broken-off portion 232 projecting from the second connecting portion 222 in the +X-axis direction.

According to the above described third embodiment, when the vibrator element 1B is placed in the package 4 to be described later, contact of the substrate 2B (particularly, the broken-off portions 231, 232) with the package 4 may be reduced. As a result, the package 4 may be downsized. Further, secondary vibrations (unnecessary vibrations) as vibrations at different frequencies (e.g. in the flexural vibration mode) from that of the principal vibration (the intended thickness-shear vibration) of the vibrating part 20 may be reduced.

Fourth Embodiment

Next, the fourth embodiment of the vibrator element will be explained.

Figure 8:
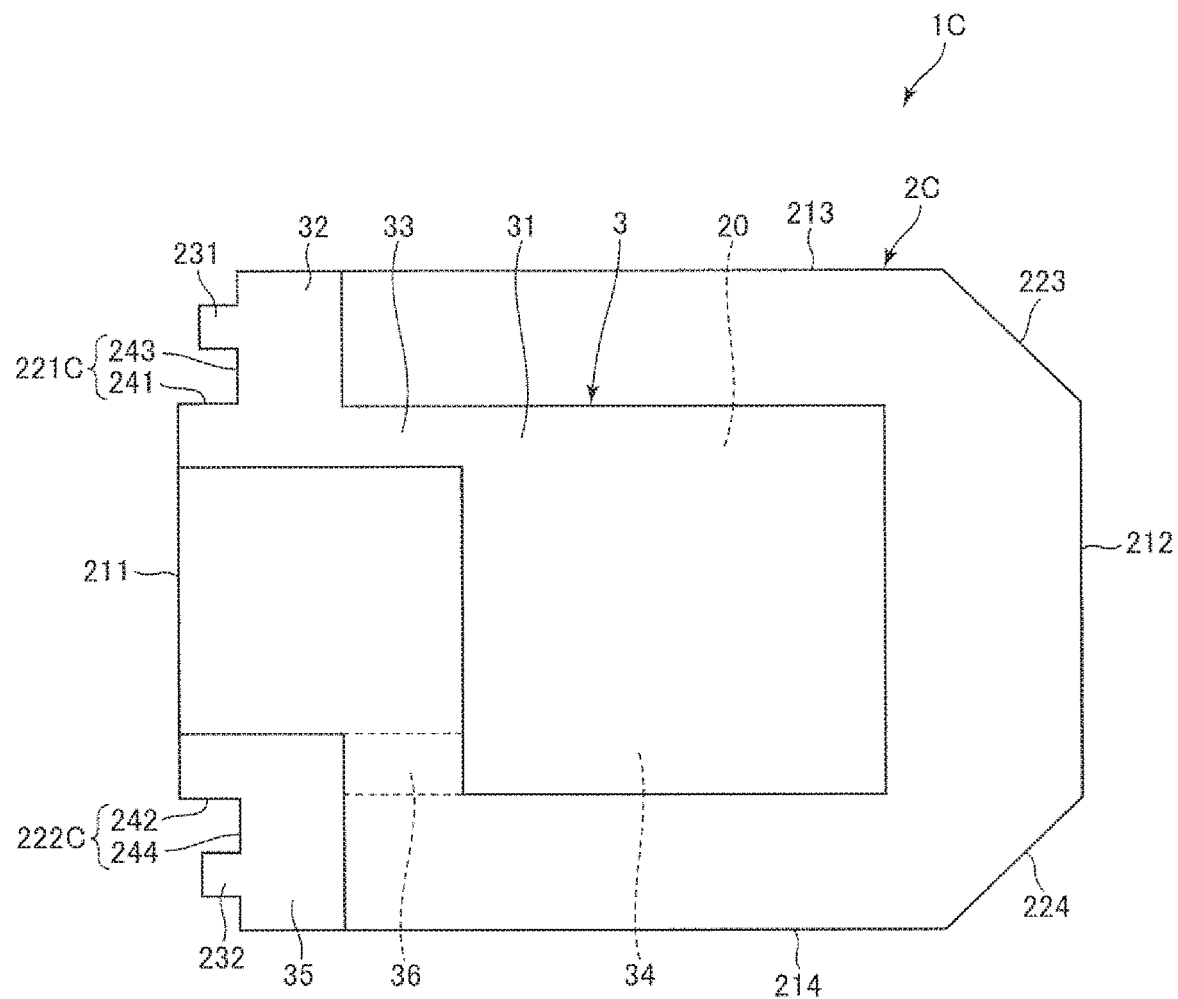
FIG. 8 is a plan view showing a vibrator element according to the fourth embodiment.

FIG. 8 is a plan view showing a vibrator element according to the fourth embodiment.

As below, the vibrator element of the fourth embodiment will be explained with a focus on differences from the above described embodiments, and the explanation of the same items will be omitted. In FIG. 8, the same configurations as those of the above described embodiments have the same signs.

The fourth embodiment is the same as the above described first embodiment except that the plan view shape of the substrate is different.

A vibrator element 1C shown in FIG. 8 includes a substrate 2C having the vibrating part 20 and the electrode 3 provided on the substrate 2C.

The substrate 2C has substantially a rectangular shape with only two corners respectively C-chamfered and the other two corners cut off in rectangular shapes in the plan view. That is, the substrate 2C has the first side 211, the second side 212, the third side 213, and the fourth side 214, a first connecting portion 221C having a shape bended inward and connecting the adjacent ends of the first side 211 and the third side 213, a second connecting portion 222C having a shape bended inward and connecting the adjacent ends of the first side 211 and the fourth side 214, the third connecting portion 223, and the fourth connecting portion 224 in the plan view. Further, the substrate 2C has the broken-off portion 231 projecting from the first connecting portion 221C in the +X-axis direction and the broken-off portion 232 projecting from the second connecting portion 222C in the +X-axis direction.

Here, the first connecting portion 221C is formed by a part 241 extending in the direction (first direction) of thickness-shear vibration of the vibrating part 20 and a part 243 extending in the direction (second direction) crossing (orthogonal to) the direction, and bends to be recessed toward inside of the substrate 2C in the plan view. Similarly, the second connecting portion 222C is formed by apart 242 extending in the direction (first direction) of thickness-shear vibration of the vibrating part 20 and a part 244 extending in the direction (second direction) crossing (orthogonal to) the direction, and bends to be recessed toward inside of the substrate 2C in the plan view. Thereby, the broken-off portions 231, 232 are easily positioned within the above described region R. Further, the direction in which the parts 241, 242 extend and the direction in which the parts 243, 244 extend are orthogonal, and thereby, the number of modes of unnecessary vibration may be reduced as is the case of the above described first embodiment.

According to the above described fourth embodiment, when the vibrator element 1C is placed in the package 4 to be described later, contact of the substrate 2C (particularly, the broken-off portions 231, 232) with the package 4 may be reduced. As a result, the package 4 may be downsized. Further, secondary vibrations (unnecessary vibrations) as vibrations at different frequencies (e.g. in the flexural vibration mode) from that of the principal vibration (the intended thickness-shear vibration) of the vibrating part 20 may be reduced.

2. Vibrator

Next, an embodiment of a vibrator will be explained.

Figure 9:
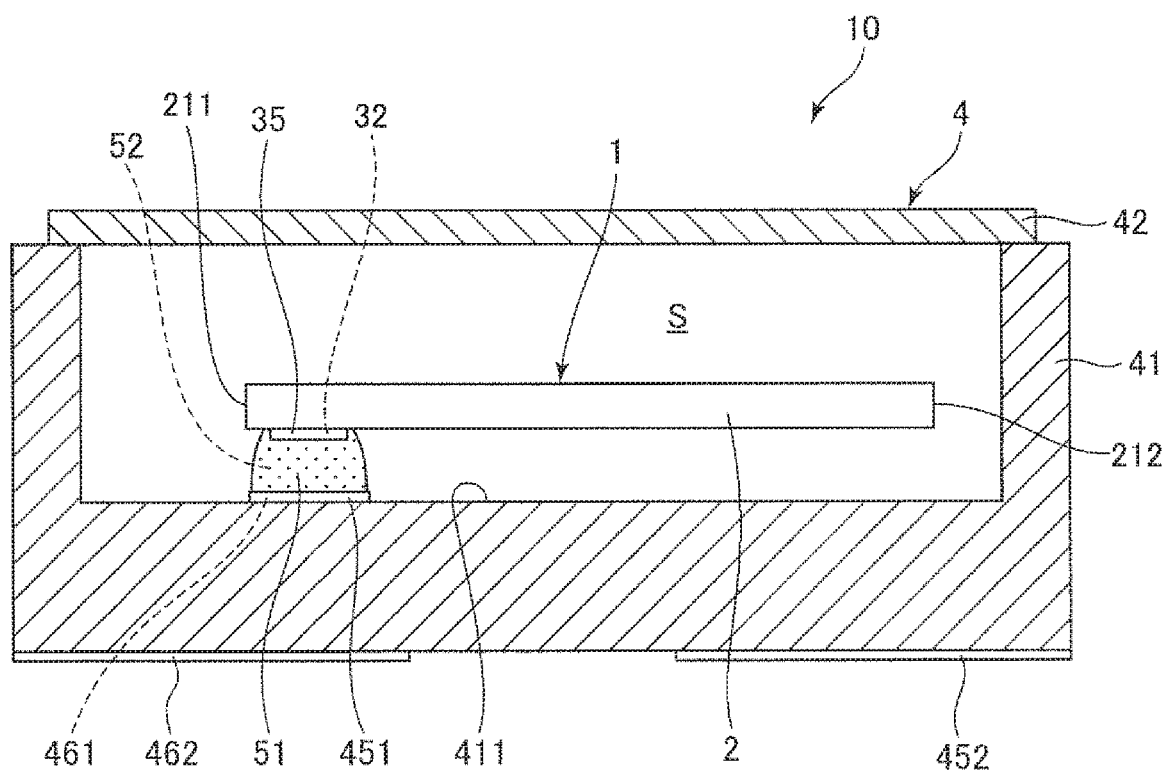
FIG. 9 is a sectional view showing an embodiment of a vibrator.

FIG. 9 is a sectional view showing an embodiment of a vibrator.

A vibrator 10 shown in FIG. 9 has the above described vibrator element 1 (any one of 1A, 1B, or 1C, the same applies to the following description), and the package 4 housing the vibrator element 1.

The package 4 has a box-shaped base 41 having a concave portion 411, and a plate-like lid 42 joined to the base 41 to close the opening of the concave portion 411. Further, the vibrator element 1 is housed within a space S formed by the concave portion 411 closed by the lid 42. For example, the space S may be at reduced pressure (in vacuum). Or, an inert gas such as nitrogen, helium, or argon may be enclosed therein.

The constituent material of the base 41 is not particularly limited, but various ceramics including aluminum oxide may be used. Further, the constituent material of the lid 42 is not particularly limited, but preferably a member having a coefficient of linear expansion closer to the constituent material of the base 41. For example, when the constituent material of the base 41 is the above described ceramics, an alloy including kovar is preferable. Note that the joint between the base 41 and the lid 42 is not particularly limited, but may be joined via an adhesive material or joined by seam welding or the like, for example.

Connection electrodes 451, 461 are formed on the bottom surface of the concave portion 411 of the base 41. Further, external mounting terminals 452, 462 are formed on the bottom surface of the base 41 (on the surface opposite to the concave portion 411). The connection electrode 451 is electrically connected to the external mounting terminal 452 via a through electrode (not shown) formed in the base 41, and the connection electrode 461 is electrically connected to the external mounting terminal 462 via a through electrode (not shown) formed in the base 41.

The vibrator element 1 housed within the space S is fixed to the base 41 by two conducting adhesive materials 51, 52 so that the first side 211 side of the substrate 2 (any one of 2A, 2B, or 2C, the same applies to the following description) may be a fixed end and the second side 212 side may be a free end. The conducting adhesive material 51 connects the connection electrode 451 and the pad electrode 32. Thereby, the connection electrode 451 and the pad electrode 32 are electrically connected via the conducting adhesive material 51. On the other hand, the conducting adhesive material 52 connects the connection electrode 461 and the pad electrode 35. Thereby, the connection electrode 461 and the pad electrode 35 are electrically connected via the conducting adhesive material 52. The conducting adhesive materials 51, 52 are not particularly limited as long as the materials have conductivity and adhesiveness. For example, silicone, epoxy, acryl, polyimide, bismaleimide adhesive materials with conducting filler dispersed therein may be used.

As described above, the vibrator 10 has the vibrator element 1 and the package housing the vibrator element 1. According to the vibrator 10, when the vibrator element 1 is placed in the package 4, contact of the substrate 2 (particularly, the broken-off portions 231, 232) with the package 4 is reduced, and thereby, downsizing of the package 4, i.e., downsizing of the vibrator 10 may be realized. Further, secondary vibrations (unnecessary vibrations) of the vibrator element 1 are reduced, and thereby, characteristics of the vibrator 10 may be improved.

3. Oscillator

Next, an embodiment of an oscillator will be explained.

Figure 10:
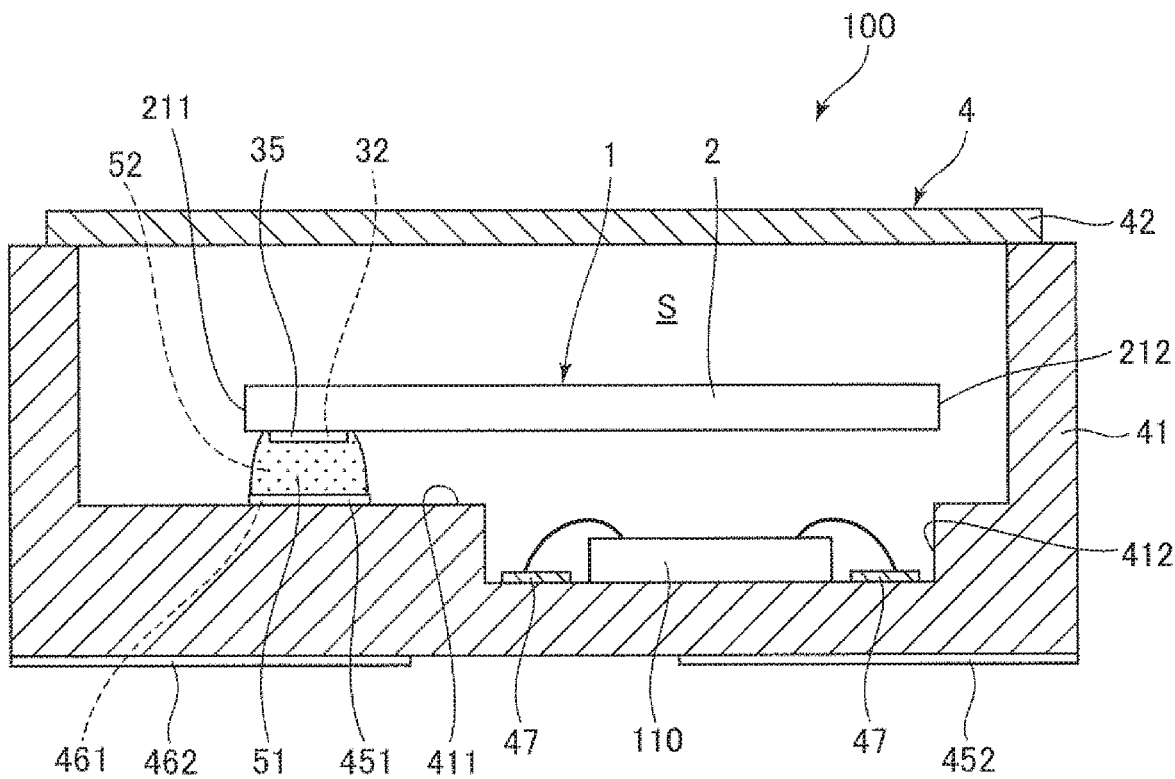
FIG. 10 is a sectional view showing an embodiment of an oscillator.

FIG. 10 is a sectional view showing an embodiment of an oscillator.

An oscillator 100 shown in FIG. 10 has the vibrator element 1 (any one of 1A, 1B, or 1C, the same applies to the following description), the package 4 housing the vibrator element 1, and a circuit 110 for driving the vibrator element 1. As below, the oscillator 100 will be explained with a focus on differences from the above described vibrator 10, and the explanation of the same items will be omitted.

As shown in FIG. 10, in the oscillator 100, a concave portion 412 is further provided in the bottom surface of the concave portion 411 of the base 41, and the circuit 110 is fixed to the bottom surface of the concave portion 412 using an adhesive agent or the like (not shown). The circuit 110 is formed by an IC (Integrated Circuit) chip and electrically connected to a plurality of internal terminals 47 provided on the bottom surface of the concave portion 412. Some of the plurality of internal terminals 47 are connected to the connection electrodes 451, 461 and the others are connected to the external mounting terminals 452, 462. Further, the circuit 110 has an oscillation circuit for driving the vibrator element 1. When the vibrator element 1 is driven by the circuit 110, a signal at a predetermined frequency may be extracted.

As described above, the oscillator 100 has the vibrator element 1, the package 4 housing the vibrator element 1, and the circuit 110 for driving the vibrator element 1. According to the oscillator 100, when the vibrator element 1 is placed in the package 4, contact of the substrate 2 (particularly, the broken-off portions 231, 232) with the package 4 is reduced, and thereby, downsizing of the package 4, i.e., downsizing of the oscillator 100 may be realized. Further, secondary vibrations (unnecessary vibrations) of the vibrator element 1 are reduced, and thereby, characteristics of the oscillator 100 may be improved.

4. Electronic Apparatuses

Next, embodiments of electronic apparatuses will be explained.

Figure 11:
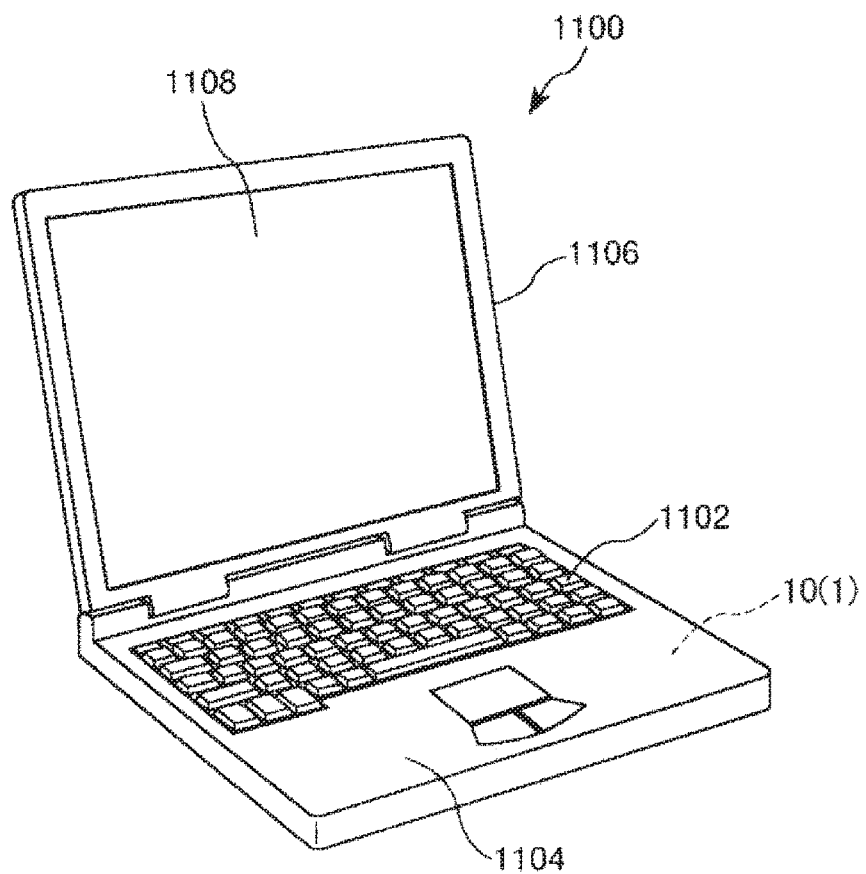
FIG. 11 is a perspective view showing a configuration of a mobile (or notebook) personal computer as an example of an electronic apparatus.

FIG. 11 is a perspective view showing a configuration of a mobile (or notebook) personal computer as an example of an electronic apparatus. In the drawing, a personal computer 1100 includes a main body unit 1104 having a keyboard 1102 and a display unit 1106 having a display part 1108, and the display unit 1106 is rotatably supported with respect to the main body unit 1104 via a hinge structure part. The personal computer 1100 contains the vibrator 10 (vibrator element 1) that functions as a filter, resonator, reference clock, or the like.

Figure 12:
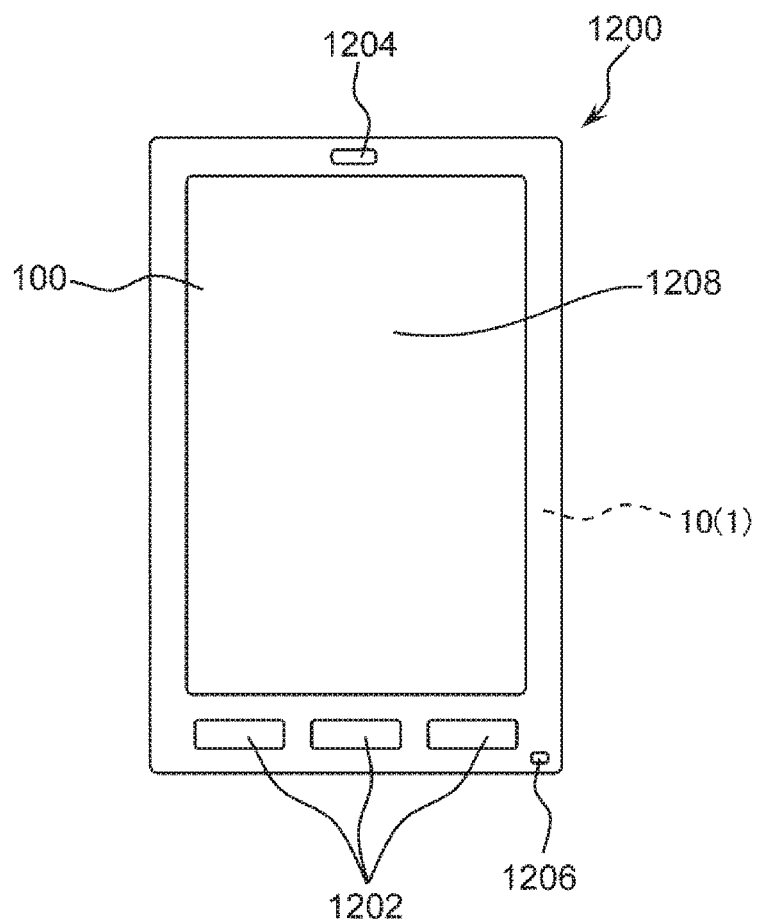
FIG. 12 is a perspective view showing a configuration of a smartphone as an example of the electronic apparatus.

FIG. 12 is a perspective view showing a configuration of a smartphone as an example of the electronic apparatus. In the drawing, a cell phone 1200 includes a plurality of operation buttons 1202, an earpiece 1204, and a mouthpiece 1206, and a display unit 1208 is placed between the operation buttons 1202 and the earpiece 1204. The cell phone 1200 contains the vibrator 10 (vibrator element 1) that functions as a filter, resonator, or the like.

Figure 13:
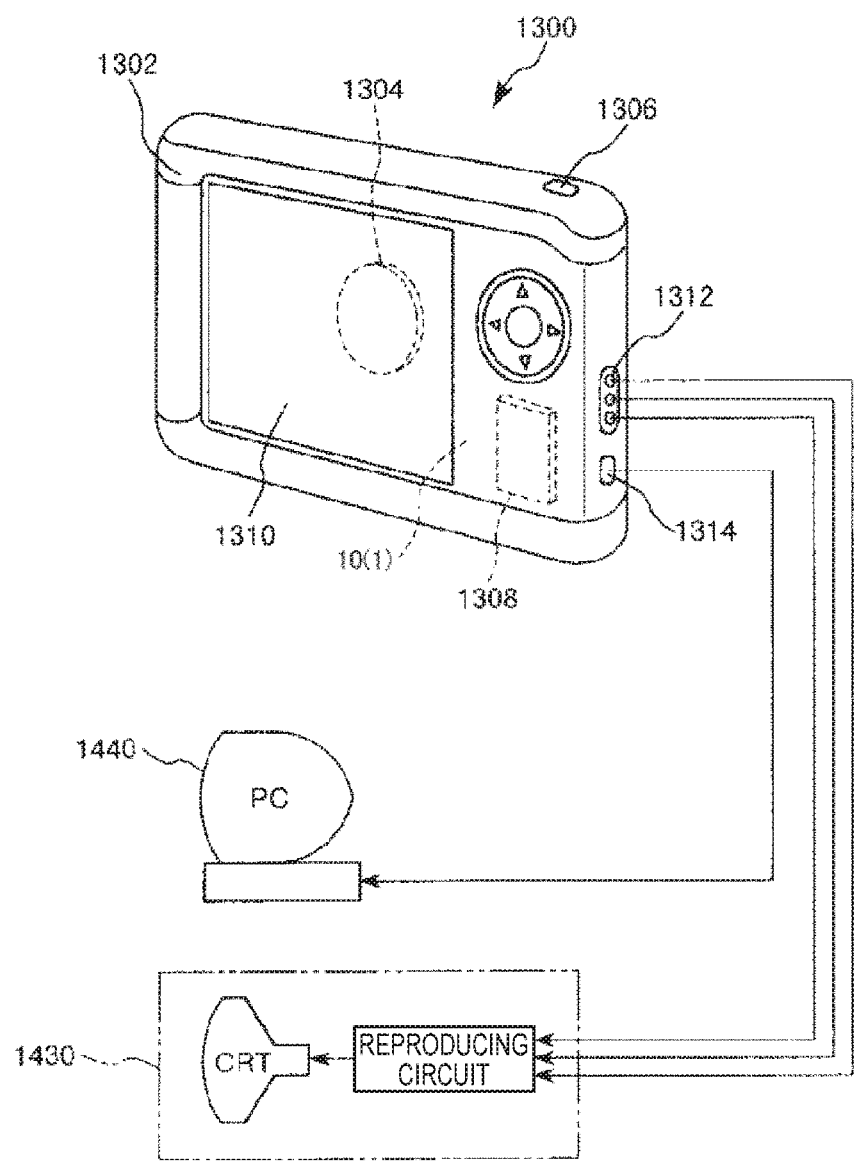
FIG. 13 is a perspective view showing a configuration of a digital still camera as an example of the electronic apparatus.

FIG. 13 is a perspective view showing a configuration of a digital still camera as an example of the electronic apparatus. Note that, in the drawing, also, connections to external apparatuses are simply shown. A display unit 1310 is provided on the back surface of a case (body) 1302 in a digital still camera 1300 and adapted to display based on imaging signals by a CCD, and the display unit 1310 functions as a finder that displays a subject as an electronic image. Further, a light receiving unit 1304 including an optical lens (imaging system), CCD, etc. is provided on the front side (the rear surface side in the drawing) of the case 1302.

A photographer checks a subject image displayed on the display unit 1310 and presses a shutter button 1306, and then, the imaging signals of the CCD at the moment are transferred and stored in a memory 1308. Further, in the digital still camera 1300, a video signal output terminal 1312 and an input/output terminal 1314 for data communications are provided on the side surface of the case 1302. As shown in the drawing, a television monitor 1430 is connected to the video signal output terminal 1312 and a personal computer 1440 is connected to the input/output terminal 1314 for data communications, respectively, as appropriate. Furthermore, the imaging signals stored in the memory 1308 are output to the television monitor 1430 and the personal computer 1440 by predetermined operations. The digital still camera 1300 contains the vibrator 10 (vibrator element 1) that functions as a filter, resonator, or the like.

The above described electronic apparatuses have the vibrator element 1 (any one of 1A, 1B, or 1C). According to the electronic apparatuses, characteristics of the electronic apparatuses may be improved using the effect of the vibrator element 1.

Note that the electronic apparatus including the vibrator element may be applied to the personal computer (mobile personal computer) in FIG. 11, the smartphone (cell phone) in FIG. 12, and the digital still camera in FIG. 13, and additionally, timepieces, tablet terminals, inkjet ejection apparatuses (e.g. inkjet printers), laptop personal computers, televisions, video cameras, video tape recorders, car navigation systems, pagers, personal digital assistances (with or without communication function), electronic dictionaries, calculators, electronic game machines, word processors, work stations, videophones, security television monitors, electronic binoculars, POS terminals, medical apparatuses (e.g., electronic thermometers, sphygmomanometers, blood glucose meters, electrocardiographic measurement apparatuses, ultrasonic diagnostic apparatuses, or electronic endoscopes), fish finders, various measurement instruments, meters and gauges (e.g., meters for vehicles, airplanes, and ships), flight simulators, etc.

5. Vehicle

Next, a vehicle to which the vibrator is applied will be explained.

Figure 14:
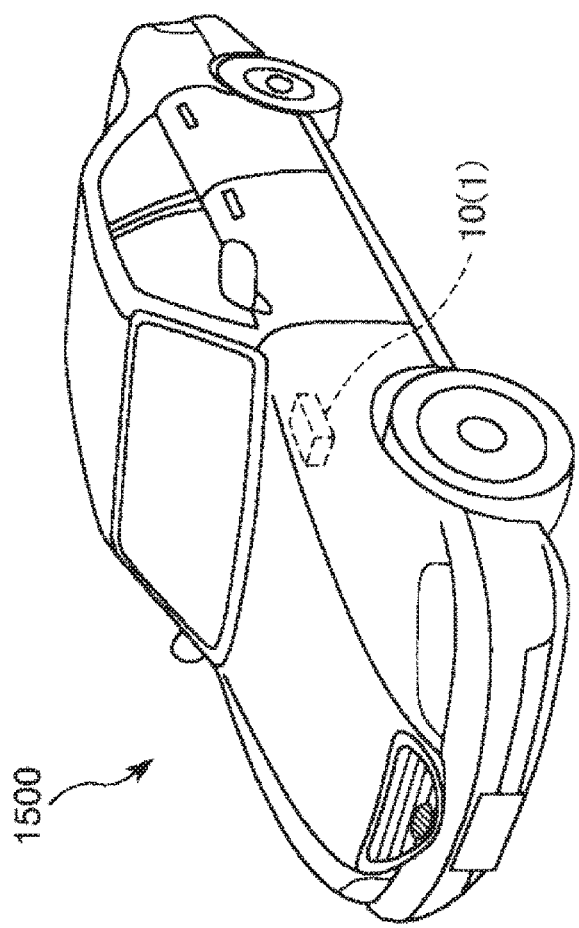
FIG. 14 is a perspective view showing an automobile as an example of a vehicle.

FIG. 14 is a perspective view showing an automobile as an example of a vehicle. The vibrator 10 (vibrator element 1) is mounted on an automobile 1500. The vibrator 10 may be widely applied to electronic control units (ECUs) including keyless entry, an immobilizer, car navigation system, car air-conditioner, antilock brake system (ABS), airbag, tire pressure monitoring system (TPMS), engine control, battery monitor for hybrid car or electric car, and vehicle body posture control system.

As above, the automobile 1500 as a vehicle has vibrator element 1 (any one of 1A, 1B, or 1C). According to the automobile 1500, characteristics of the automobile 1500 may be improved using the effect of the vibrator element 1.

As above, the vibrator element, vibrator, oscillator, electronic apparatus, and vehicle are explained based on the respective illustrated embodiments, however, the invention is not limited to those. The configurations of the respective parts may be replaced by arbitrary configurations having the same functions. Further, other arbitrary configurations may be added thereto. Furthermore, the above described respective embodiments may be appropriately combined.

In the above described embodiments, the quartz crystal substrate is used as the piezoelectric substrate, however, e.g. various piezoelectric substrates of lithium niobate, lithium tantalate, etc. may be used instead.

The entire disclosure of Japanese Patent Application No. 2017-123532, filed Jun. 23, 2017 is hereby incorporated herein by reference.

What is claimed is:

1. A vibrator element comprising:
a substrate having a vibrating part excited to perform thickness-shear vibration as principal vibration; and
an electrode placed in the vibrating part,
wherein an outer shape of the substrate in a plan view has a first side and a second side arranged in a first direction along a direction of the thickness-shear vibration and extending along a second direction crossing the first direction, a third side and a fourth side arranged in the second direction and extending in the first direction, a first connecting portion connecting the first side and the third side, and a second connecting portion connecting the first side and the fourth side,
the first connecting portion and the second connecting portion are located inside of a region surrounded by the first side, the second side, the third side, the fourth side, and extension lines of these sides in the plan view,
the substrate has a projection projecting from one of the first connecting portion and the second connecting portion, and
the projection has a fracture surface on a tip side thereof, and the projection is located inside of the region in the plan view.

2. The vibrator element according to claim 1, wherein the projections project from both the first connecting portion and the second connecting portion.

3. The vibrator element according to claim 1, wherein the outer shape of the substrate in the plan view has a third connecting portion connecting the second side and the third side and a fourth connecting portion connecting the second side and the fourth side, and
the third connecting portion and the fourth connecting portion are located inside of the region in the plan view.

4. The vibrator element according to claim 1, wherein the first connecting portion and the second connecting portion are inclined with respect to the first direction and the second direction in the plan view.

5. The vibrator element according to claim 1, wherein the first connecting portion and the second connecting portion are curved to project to outside of the substrate in the plan view.

6. The vibrator element according to claim 1, wherein the first connecting portion and the second connecting portion are formed by parts along the first direction and parts along the second direction and bend to be recessed toward inside of the substrate in the plan view.

7. The vibrator element according to claim 1, wherein a length of the first side and a length of the second side are equal.

8. The vibrator element according to claim 1, wherein the electrode has an excitation electrode provided in the vibrating part, and
a length of the excitation electrode along the second direction is shorter than a length of the first side or the second side along the second direction.

9. A vibrator comprising;
the vibrator element according to claim 1; and
a package housing the vibrator element.

10. A vibrator comprising;
the vibrator element according to claim 2; and
a package housing the vibrator element.

11. A vibrator comprising;
the vibrator element according to claim 3; and
a package housing the vibrator element.

12. An oscillator comprising;
the vibrator element according to claim 1;
a package housing the vibrator element; and
a circuit that drives the vibrator element.

13. An oscillator comprising;
the vibrator element according to claim 2;
a package housing the vibrator element; and
a circuit that drives the vibrator element.

14. An oscillator comprising;
the vibrator element according to claim 3;
a package housing the vibrator element; and
a circuit that drives the vibrator element.

15. An electronic apparatus comprising;
the vibrator element according to claim 1; and
a display unit.

16. An electronic apparatus comprising;
the vibrator element according to claim 2; and
a display unit.

17. An electronic apparatus comprising;
the vibrator element according to claim 3; and
a display unit.

18. A vehicle comprising;
the vibrator element according to claim 1; and
an electronic control unit on which the vibrator element is mounted.

19. A vehicle comprising;
the vibrator element according to claim 2; and
an electronic control unit on which the vibrator element is mounted.

* * * * *